(12) United States Patent
Sunwoo et al.

(10) Patent No.: US 9,405,615 B2
(45) Date of Patent: Aug. 2, 2016

(54) METHOD OF OPERATING NONVOLATILE MEMORY DEVICE COMPRISING RESISTANCE MATERIAL

(71) Applicant: SAMSUNG ELECTRONICS CO., LTD., Suwon-Si, Gyeonggi-Do (KR)

(72) Inventors: Jung Sunwoo, Seoul (KR); Kwang-Jin Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 84 days.

(21) Appl. No.: 14/278,354

(22) Filed: May 15, 2014

(65) Prior Publication Data

US 2015/0052394 A1 Feb. 19, 2015

(30) Foreign Application Priority Data

Aug. 19, 2013 (KR) ......................... 10-2013-0097994

(51) Int. Cl.
| | |
|---|---|
| *G11C 29/00* | (2006.01) |
| *G06F 11/10* | (2006.01) |
| *G11C 29/02* | (2006.01) |
| *G11C 11/16* | (2006.01) |
| *G11C 13/00* | (2006.01) |
| *G11C 16/26* | (2006.01) |
| *G11C 29/04* | (2006.01) |

(52) U.S. Cl.
CPC ............ *G06F 11/10* (2013.01); *G11C 11/1673* (2013.01); *G11C 13/0004* (2013.01); *G11C 13/004* (2013.01); *G11C 16/26* (2013.01); *G11C 29/021* (2013.01); *G11C 29/028* (2013.01); *G11C 2013/0054* (2013.01); *G11C 2013/0057* (2013.01); *G11C 2029/0409* (2013.01); *G11C 2029/0411* (2013.01)

(58) Field of Classification Search
CPC ............ G06F 11/1402; G06F 11/1068; G06F 12/0246; G11C 16/10; G11C 16/26; G11C 11/5628; G11C 11/5642; G11C 2211/5634; G11C 29/00; G11C 16/28; G11C 2029/0411; G11C 2029/0409; G11C 16/3404; G11C 29/02; G11C 29/026; G11C 29/028; G11C 29/42

See application file for complete search history.

(56) References Cited

U.S. PATENT DOCUMENTS

| | | |
|---|---|---|
| 5,533,031 A | 7/1996 | Dounn et al. |
| 6,687,194 B1 | 2/2004 | Kobayashi et al. |

(Continued)

FOREIGN PATENT DOCUMENTS

| | | |
|---|---|---|
| JP | 2007-035190 | 8/2004 |
| JP | 3590390 | 2/2007 |

(Continued)

*Primary Examiner* — Guerrier Merant
(74) *Attorney, Agent, or Firm* — Volentine & Whitt, PLLC

(57) ABSTRACT

A method of operating a nonvolatile memory device comprises applying a read current with a first level to a nonvolatile memory cell comprising a variable resistance material, determining read data based on the applied read current, checking a syndrome corresponding to the read data to determine whether the read data is pass or fail, changing the read current from the first level to a second level, which is different from the first level, according to the determination of whether the read data is pass or fail, and performing a read-retry operation comprising applying the read current of the second level to the nonvolatile memory cell.

17 Claims, 18 Drawing Sheets

(56) References Cited

U.S. PATENT DOCUMENTS

| | | | | |
|---|---|---|---|---|
| 8,737,136 B2* | 5/2014 | Cometti | ................ | G11C 16/10 365/185.18 |
| 2007/0162824 A1* | 7/2007 | Radke | ................ | H03M 13/096 714/758 |
| 2008/0192541 A1* | 8/2008 | Kang | ................ | G11C 11/5642 365/185.03 |
| 2010/0118608 A1* | 5/2010 | Song | ................ | G11C 11/5642 365/185.11 |
| 2010/0165730 A1* | 7/2010 | Sommer | ............ | G06F 11/1068 365/185.03 |
| 2011/0016372 A1* | 1/2011 | Nelson | ............... | G06F 11/1068 714/773 |
| 2011/0066899 A1* | 3/2011 | Kang | ................ | G06F 11/1068 714/54 |
| 2011/0113284 A1 | 5/2011 | Park et al. | | |
| 2011/0289388 A1* | 11/2011 | Nelson | .............. | G11C 11/5642 714/773 |
| 2012/0008386 A1* | 1/2012 | Chilappagari | ......... | G11C 16/26 365/185.2 |
| 2012/0084490 A1* | 4/2012 | Choi | ..................... | G11C 16/02 711/103 |
| 2012/0155168 A1* | 6/2012 | Kim | ........................ | G11C 5/14 365/185.03 |
| 2012/0213001 A1* | 8/2012 | Yang | ................... | G06F 11/1048 365/185.2 |
| 2012/0216098 A1 | 8/2012 | Moro | | |
| 2012/0320671 A1* | 12/2012 | Meir | .................. | G11C 11/5642 365/185.03 |
| 2013/0107633 A1* | 5/2013 | Kim | ................... | G11C 11/5642 365/185.18 |
| 2013/0297988 A1* | 11/2013 | Wu | ..................... | G06F 11/1068 714/773 |
| 2014/0056068 A1* | 2/2014 | Strasser | .............. | G06F 11/1048 365/185.03 |
| 2014/0108891 A1* | 4/2014 | Strasser | .............. | G06F 12/0246 714/773 |
| 2014/0140148 A1* | 5/2014 | An | ..................... | G11C 11/5642 365/189.14 |

FOREIGN PATENT DOCUMENTS

| | | |
|---|---|---|
| JP | 2012-022429 | 2/2012 |
| JP | 2013-037631 | 2/2013 |
| KR | 2001-0056879 A | 7/2001 |

* cited by examiner

FIG. 2

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

Read Pass Case

Read Fail Case

METHOD OF OPERATING NONVOLATILE MEMORY DEVICE COMPRISING RESISTANCE MATERIAL

CROSS-REFERENCE TO RELATED APPLICATION

This application claims priority under 35 U.S.C. 119 to Korean Patent Application No. 10-2013-0097994 filed on Aug. 19, 2013, the subject matter of which is hereby incorporated by reference.

BACKGROUND OF THE INVENTION

Certain types of nonvolatile memory devices store data using a variable resistance material. Examples of such devices include phase change random access memory (PRAM), resistive RAM (RRAM), and magnetic RAM (MRAM).

A PRAM, for instance, comprises a plurality of phase change memory cells each comprising a phase change material that can assume a high resistance state or a low resistance state based on its lattice structure. The lattice structure can be changed by controlling the temperature of the phase change material with electrical current. The high resistance state, also referred to as a crystalline state, corresponds to a crystalline lattice structure, and the low resistance state, also referred to an amorphous state, corresponds to an amorphous lattice structure. The crystalline state is typically defined to represent "set data" or a logical "0", and the amorphous state is typically defined to represent "reset data" or a logical "1".

One shortcoming of conventional PRAM devices is that the resistance value associated with a memory cell storing "set data" may drift over time. This phenomenon is referred to as a set resistance drift. Another shortcoming is that the resistance value immediately after reset data is written may be smaller than a target value. Then, after the reset data is written and a predetermined reset stabilization time (tWTR) elapses, the resistance value reaches the target value. That is, according to a read time point, the resistance value of the set data/reset data may be changed.

SUMMARY OF THE INVENTION

In one embodiment of the inventive concept, a method of operating a nonvolatile memory device comprises applying a read current with a first level to a nonvolatile memory cell comprising a variable resistance material, determining read data based on the applied read current, checking a syndrome corresponding to the read data to determine whether the read data is pass or fail, changing the read current from the first level to a second level, which is different from the first level, according to the determination of whether the read data is pass or fail, and performing a read-retry operation comprising applying the read current of the second level to the nonvolatile memory cell.

In another embodiment of the inventive concept, a method of driving a nonvolatile memory device comprises reading reference memory cell data by applying a read current with a first level to a reference memory cell, determining whether the read reference memory cell data is pass or fail, setting the level of the read current to a second level, which is different from the first level, according to a result of the determination, performing a read-retry operation on the reference memory cell by applying a read current with a second level to the reference memory cell, and where read-retried reference memory cell data is pass, applying the read current with the second level to a normal memory cell to read normal cell data.

In another embodiment of the inventive concept, a method of operating a nonvolatile memory device comprises checking a predetermined internal signal of the nonvolatile memory device, changing a level of a read current to a first level according to a result of the checking, reading data by applying the read current with the first level to a nonvolatile memory cell comprising a resistance material, determining whether the read data is pass or fail, changing the level of the read current to a second level, which is different from the first level, according to a result of the determination of whether the read data is pass or fail, and performing a read-retry operation comprising applying the read current of the second level to the nonvolatile memory cell.

These and other embodiments of the inventive concept can potentially improve the reliability of read operations in a nonvolatile memory device by adjusting a level of a read current used by the nonvolatile memory device.

BRIEF DESCRIPTION OF THE DRAWINGS

The drawings illustrate selected embodiments of the inventive concept. In the drawings, like reference numbers indicate like features.

FIG. 2 is a block diagram illustrating a nonvolatile memory device according to an embodiment of the inventive concept.

DETAILED DESCRIPTION

Figure 1:
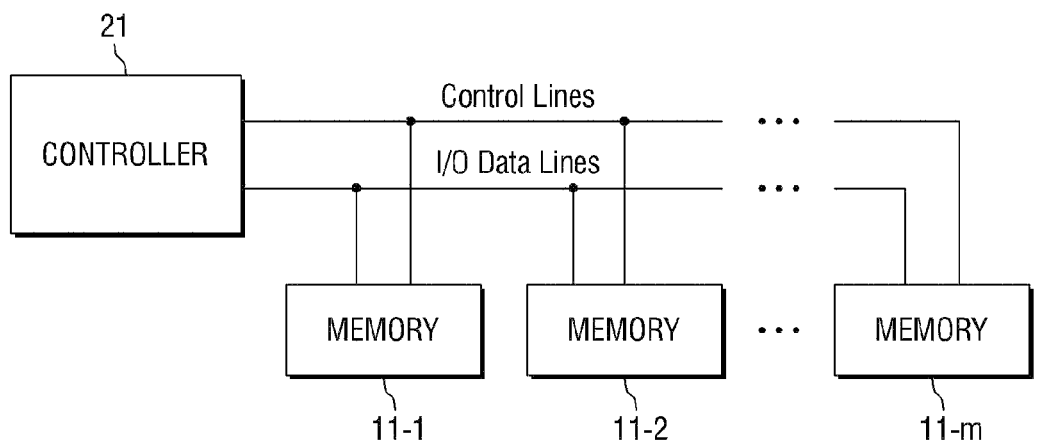
FIG. 1 is a block diagram illustrating a memory system according to an embodiment of the inventive concept.

Embodiments of the inventive concept are described below with reference to the accompanying drawings. These embodiments are presented as teaching examples and should not be construed to limit the scope of the inventive concept.

As used herein, the terms "a" and "an" and "the" and similar referents encompass both singular and plural forms of the accompanying nouns, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art. The use of any and all examples or example terms herein is intended merely to better illuminate the inventive concept and is not a limitation on the scope of the inventive concept unless otherwise specified. Unless defined otherwise, all terms defined in generally used dictionaries should not be interpreted in an overly formal sense.

The inventive concept will be described with reference to perspective views, cross-sectional views, and/or plan views, in which certain embodiments of the inventive concept are shown. The profile of an example view may be modified according to manufacturing techniques and/or allowances. That is, the illustrated embodiments are not intended to limit the scope of the inventive concept, which encompasses all variations that can be produced by changes in manufacturing processes. Thus, regions shown in the drawings are illustrated in schematic form and the shapes of the regions are presented simply by way of illustration and not limitation.

Hereinafter, embodiments of the inventive concept will be described with reference to a resistive random access memory (RRAM). However, the inventive concept is applicable to other types of nonvolatile memory devices using a resistance material, such as phase change random access memory (PRAM) and magnetic RAM (MRAM).

FIG. 1 is a block diagram illustrating a memory system according to an embodiment of the inventive concept.

Referring to FIG. 1, the memory system comprises multiple memory devices 11_1 to 11_m, and a controller 21.

Memory devices 11_1 to 11_m and controller 21 are connected with each other through control lines and input/output (I/O) data lines. For example, controller 21 may provide various commands (e.g., a write command and a read command) to memory devices 11_1 to 11_m through the control lines. Further, controller 21 may transceive data with memory devices 11_1 to 11_m through the I/O data lines.

Although FIG. 1 shows that memory devices 11_1 to 11_m share the control lines and the I/O data lines, memory devices 11-1 to 11_m are not limited thereto. For example, memory devices 11_1 to 11_m may share only the I/O data lines and may not share the control lines.

Memory devices 11_1 to 11_m may include various types of memories. For instance, they may include volatile memory devices, such as DRAM, and a nonvolatile memory device, such as a NAND flash memory and an NOR flash memory. Further, memory devices 11_1 to 11_m may include resistive memory devices such as PRAM, RRAM, or MRAM.

Controller 21 adjusts a level of a read current used in the nonvolatile memory device, which can be used to improve read reliability. An operation of adjusting the level of the read current will be described below in detail with reference to FIGS. 5 to 17.

FIG. 2 is a block diagram illustrating a nonvolatile memory device according to an embodiment of the inventive concept. For convenience, FIG. 2 illustrates an example nonvolatile memory device comprising 16 memory banks, but the described nonvolatile memory device is not limited thereto.

Referring to FIG. 2, the nonvolatile memory device comprises a memory cell array, multiple sense amplifiers and write drivers 2_1 to 2_8, and a peripheral circuit region 3.

The memory cell array comprises multiple memory banks 1_1 to 1_16. Each of the memory banks comprises multiple memory blocks BLK0 to BLK7, and each of the memory blocks comprises multiple nonvolatile memory cells arranged in a matrix. Although this description has memory banks comprising 8 memory blocks, the inventive concept is not limited thereto.

Although not illustrated in detail in FIG. 2, row and column selection circuits designating rows and columns of the resistive memory cell for write/read operations may be used with corresponding memory banks 1_1 to 1_16.

Sense amplifier and write drivers 2_1 to 2_8 are disposed to correspond to two memory banks 1_1 to 1-16, to perform a read and write operation in the corresponding memory banks. In certain embodiments, sense amplifier and write drivers 2_1 to 2_8 correspond to two memory banks 1_1 to 1_16, but the inventive concept is not limited thereto. Alternatively, for instance, sense amplifier and write drivers 2_1 to 2_8 may be disposed to correspond one or four memory banks.

Multiple logic circuit blocks and a voltage generator for operating the column selection circuit, the row selection circuit, the sense amplifier and write drivers 2_1 to 2_8, and the like may be disposed in peripheral circuit region 3.

Figure 3:
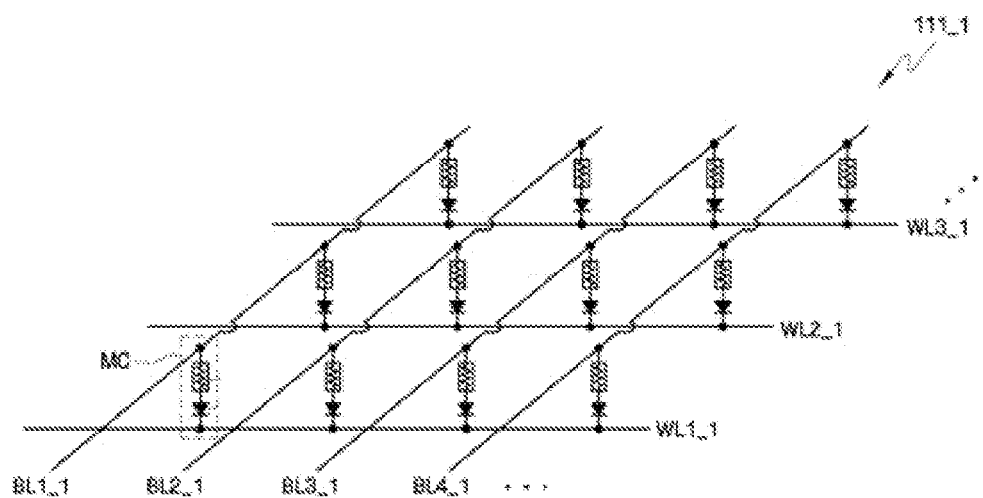
FIG. 3 is a diagram illustrating a memory cell array of FIG. 2 according to an embodiment of the inventive concept.
Figure 4:
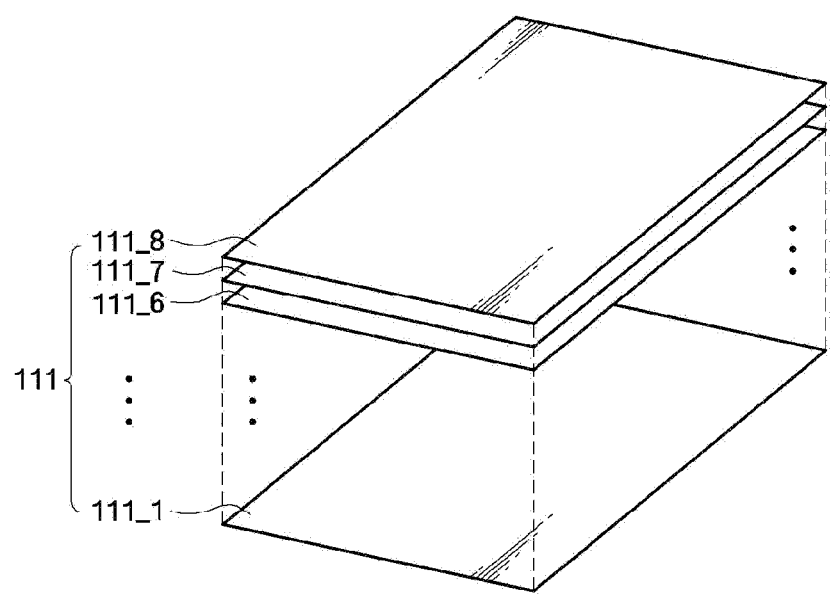
FIG. 4 is a diagram illustrating the memory cell array of FIG. 2 according to an embodiment of the inventive concept.

FIGS. 3 and 4 are diagrams illustrating the memory cell array of FIG. 2, according to an embodiment of the inventive concept.

Referring to FIG. 3, the memory cell array has a cross point structure, which is a structure in which one memory cell is formed in a region in which lines cross each other. For example, bit lines BL1_1 to BL4_1 are extended in a first direction, and word lines WL1_1 to WL3_1 are extended in a second direction so as to cross the bit lines BL1_1 to BL4_1, and resistive memory cells MC may be formed in the regions in which the respective bit lines BL1_1 to BL4_1 cross the respective word lines WL1_1 to WL3_1.

Alternatively, the memory cell array may have a 3D stack structure as illustrated in FIG. 4. The 3D stack structure is a form in which multiple memory cell layers 111_1 to 111_8 are vertically stacked. Although FIG. 4 illustrates a form in which the eights memory cell layers 111_1 to 111_8 are stacked, the inventive concept is not limited thereto. Here, each of memory cell layers 111_1 to 111_8 may include multiple memory cell groups and/or multiple redundancy memory cell groups. Where the memory cell array has the 3D stack structure, each of memory cell layers 111_1 to 111_8 may have the cross point structure illustrated in FIG. 3, but the stack form is not limited thereto.

Figure 5:
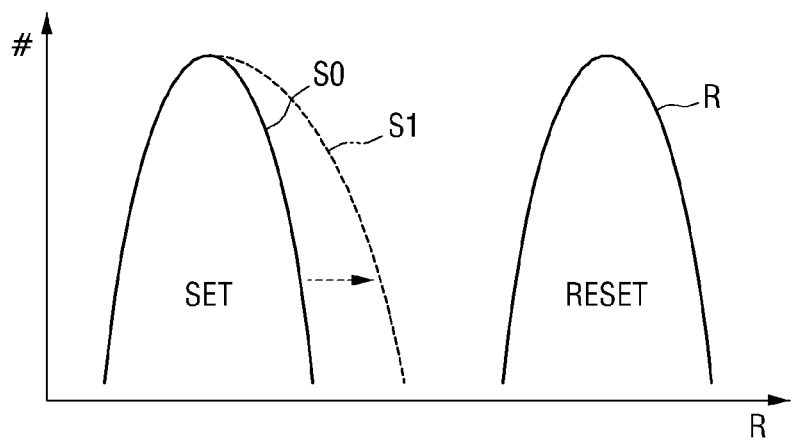
FIG. 5 is a diagram illustrating a resistance distribution of resistive memory cells in a nonvolatile memory device according to an embodiment of the inventive concept.
Figure 6:
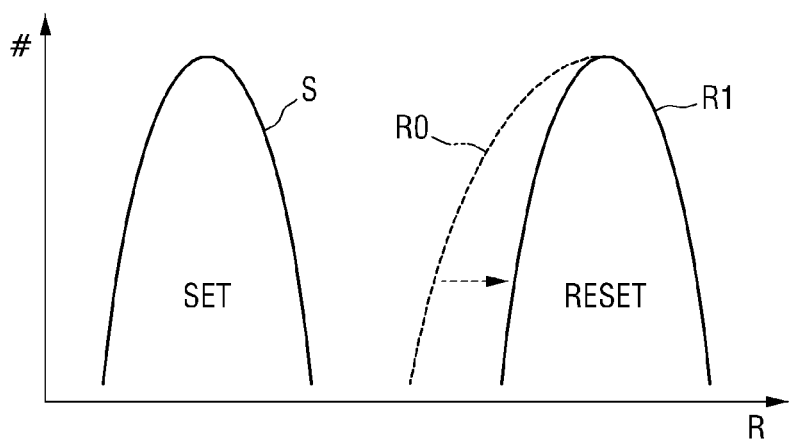
FIG. 6 is a diagram illustrating a resistance distribution of resistive memory cells in a nonvolatile memory device according to an embodiment of the inventive concept.

FIGS. 5 and 6 are diagrams illustrating a resistance distribution of the resistive memory cells used in a nonvolatile memory device according to an embodiment of the inventive concept. Although FIGS. 5 and 6 illustrate a single bit cell in which data of 1 bit is stored, the inventive concept is not limited thereto. Alternatively, for instance, the inventive concept may be applied to a multi bit cell in which data of 2 bits or more is stored. In FIGS. 5 and 6, the x-axis represents resistance, and the y-axis represents the number of cells.

Referring to FIG. 5, immediately after a write operation, a resistive memory cell may have a first resistance distribution S0 corresponding to set data SET or a second resistance distribution R corresponding to reset data RESET. However, according to the lapse of time after the write operation, or a change in an operating environment, such as a time and a temperature, the resistance distribution corresponding to set data SET may increase from S0 to S1. The phenomenon is referred to as a set resistance drift. Accordingly, when the set data SET is read a long time after the writing of the set data SET, it is highly likely that an error is generated.

Referring to FIG. 6, immediately after a write operation, a resistive memory cell may have a first resistance distribution S corresponding to set data SET or a second resistance distribution R0 corresponding to reset data RESET. However, according to the lapse of the time after the write operation, or a change in an operation environment, such as a time and a temperature, the resistance distribution corresponding to the reset data RESET may increase from R0 to R1. A time in which the resistance distribution is changed from R0 to R1 is referred to as a reset stabilization time tWTR. Accordingly, when the reset data RESET is read before the lapse of the reset stabilization time, it is highly likely that an error is generated.

However, in order to address the change in the resistance distribution, nonvolatile memory devices according to the certain embodiments of the inventive concept reset a level of the read current and perform a read retry operation when the error is generated in the first read operation. This tends to improve reliability of the read operation through the read retry operation.

Figure 7:
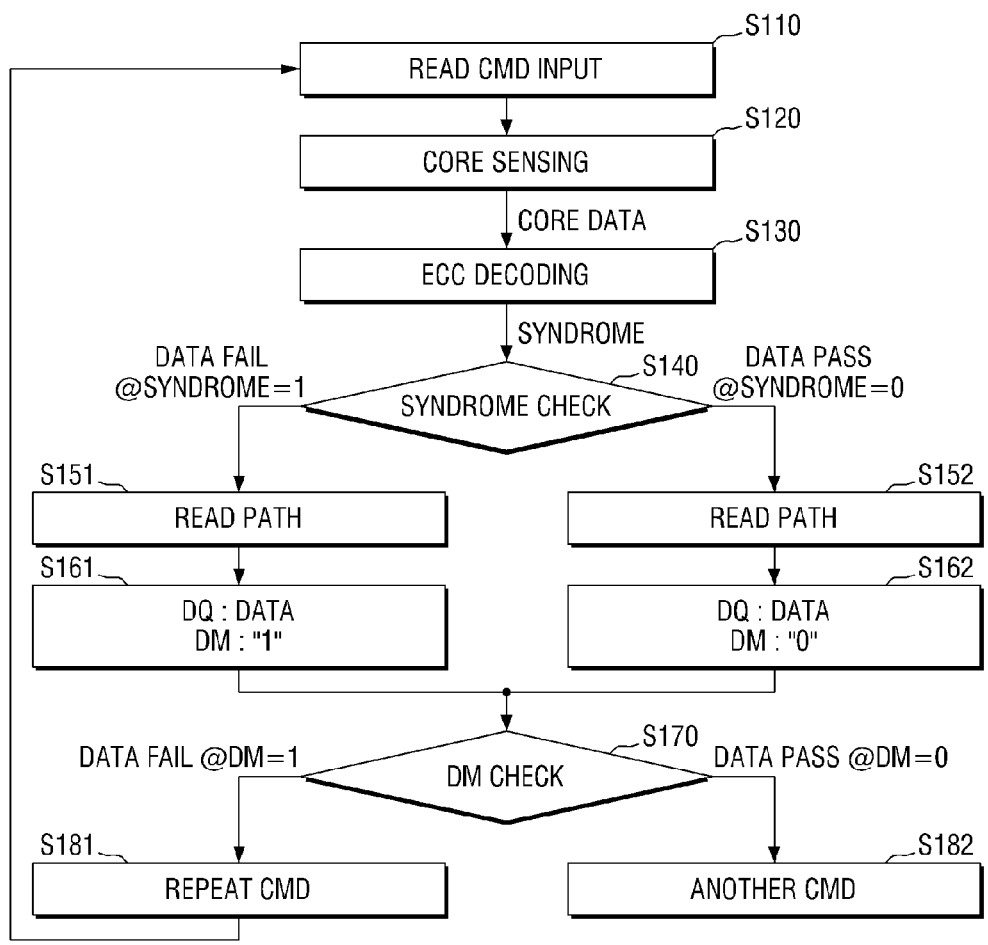
FIG. 7 is a flowchart illustrating a method of driving a nonvolatile memory device according to an embodiment of the inventive concept.
Figure 8:
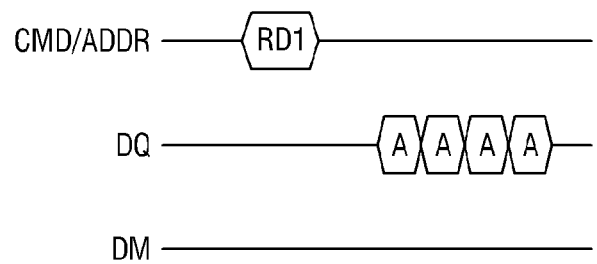
FIG. 8 is a timing diagram illustrating the method of FIG. 7 according to an embodiment of the inventive concept.
Figure 9:
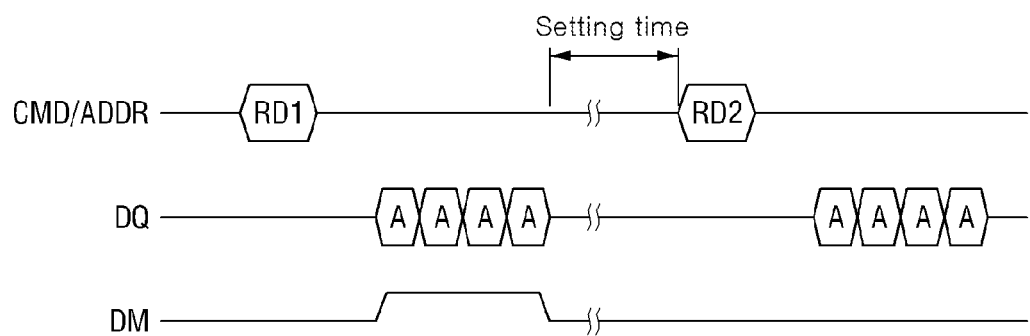
FIG. 9 is another timing diagram illustrating the method of FIG. 7 according to an embodiment of the inventive concept.
Figure 10:
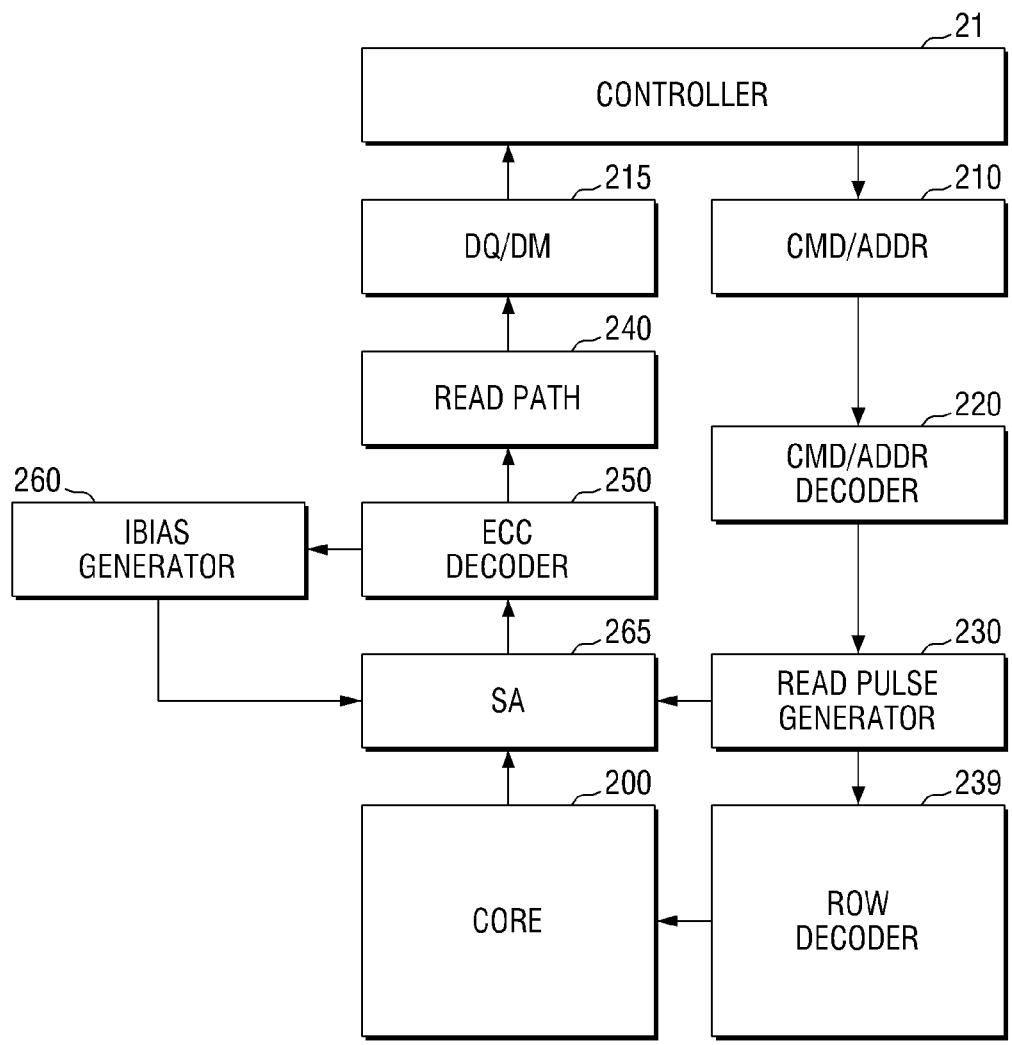
FIG. 10 is a block diagram illustrating the nonvolatile memory device according to the first embodiment of the inventive concept.

FIG. 7 is a flowchart illustrating a method of driving a nonvolatile memory device according to an embodiment of the inventive concept. FIGS. 8 and 9 are timing diagrams illustrating the method of FIG. 7, according to embodiments of the inventive concept. FIG. 10 is a block diagram illustrating a nonvolatile memory device capable of performing the method of FIG. 7 according to an embodiment of the inventive concept.

Referring to FIG. 7, a read command RD1 is input from a controller (S110). Next, a core sensing operation is performed (S120). That is, data is read from the nonvolatile memory cells disposed in a memory cell array within a core. The data is read by providing a read current of a first level to the nonvolatile memory cell. Next, error correction using an error correcting code (ECC) decoding is performed (S130). This typically involves generation of a syndrome corresponding to the read data.

Next, the syndrome is checked (S140) to determine whether the read data has been read successfully ("pass") or not ("fail"). When the read data is fail, the syndrome is 1, and when the read data is pass, the syndrome is 0.

Where the syndrome is 1, the data is output to a DQ pin and 1 is output to a DM pin (S161) via a read path (S151). Where the syndrome is 0, the data is output to the DQ pin and 0 is output in the DM pin (S162) via a read path (S152). Here, the DQ pin means a pin to which the data is output, and the DM pin is a data masking pin used for writing. The DM pin may also be used for outputting a determination result by the syndrome during the read operation, although the pin outputting the determination result by the syndrome is not limited to the DM pin.

The controller checks a value output from the DM pin (S170). Where the value output from the DM pin is 0, the controller provides a new command to the nonvolatile memory device (S182). Where the value output from the DM pin is 1, the controller provides a second read command RD2 commanding a read retry to the nonvolatile memory device (S181).

Where the read retry operation is performed, the controller sets the level of the read current to a second level, which is different from the first level. The data is re-read by providing a read current of the second level to the nonvolatile memory cell.

In the meantime, the number of repeated times of the read current resetting operations and the read retry operations may be designated in advance. Otherwise, the read current resetting operations and the read retry operations may be repeated.

Here, a case of read pass will be described with reference to FIG. 8. The read command RD1 is input through a command pin/address pin (CMD/ADDR). As a result, multiple units of data are output through the DQ pin, and 0 is output through the DM pin.

A case of read fail will be described with reference to FIG. 9. First read command RD1 is input through the command pin/address pin (CMD/ADDR). As a result, 1 is output through the DM pin during the output of the units of data through the DQ pin. Because 1 is output through the DM pin, the read retry operation is performed.

After a predetermined time, second read command RD2 is input through the command pin/address pin (CMD/ADDR). As a result, 0 is output through the DM pin during the output of the units of data through the DQ pin. Because 0 is output through the DM pin, the read retry operation is not performed. Here, the "predetermined time" corresponds to a setting time taken for changing the level of the read current from the first level to the second level.

Otherwise, multiple read currents having different levels may be generated in advance. Accordingly, in the change in the level of the read current, the level of the read current may be set through a simple switching operation. That is, to provide the read current of the first level, any one read current among the read currents, which is generated in advance, is selected and provided. To provide the read current with the second level, another read current among the read currents, which is generated in advance, is selected and provided. By using the aforementioned method, it is possible to considerably decrease the setting time taken to change the level of the read current.

Referring to FIG. 10, the nonvolatile memory device comprises a core 200, a command pin/address pin (CMD/ADDR) 210, a command/address decoder 220, a read pulse generator 230, a row decoder 239, a DQ pin/DM pin 215, a read path 240, an ECC decoder 250, a sense amplifier 265, and a read current generator 260.

Controller 21 provides first read command RD1 to command pin/address pin (CMD/ADDR) 210. First read command RD1 is decoded by command/address decoder 220, and read pulse generator 230 generates various read pulses for performing the read operation according to a result of the decoding. The generated read pulse is transferred to row decoder 239 and sense amplifier 265. Sense amplifier 265 reads data from the nonvolatile memory cell within core 200 selected by row decoder 239. ECC decoder 250 generates a corresponding syndrome from the read data. Read current generator 260 may change the level of the read current based on a value of the syndrome. The read data is output through the DQ pin, and the syndrome (0 or 1) is output through DM pin 215 via read path 240.

Where syndrome 1 is output through the DM pin, controller 21 provides second command RD2 to command pin/address pin (CMD/ADDR) 210 again. Subsequent procedures are similar to those described above. Read current generator 260 changes the level of the read current again based on the value of the syndrome.

Here, read current generator 260 may receive, for example, a constant voltage (DC) for sensing, and generate a read current corresponding to the constant voltage (DC) for sensing. Accordingly, the level of the read current may be changed according to the change in the level of the constant voltage for sensing. Accordingly, the setting of the level of the read current from the first level to the second level may include changing the level of the constant voltage DC for sensing according to the determination result (that is, the value of the syndrome), and generating the read current of the second level by using the changed constant voltage for sensing.

Figure 11:
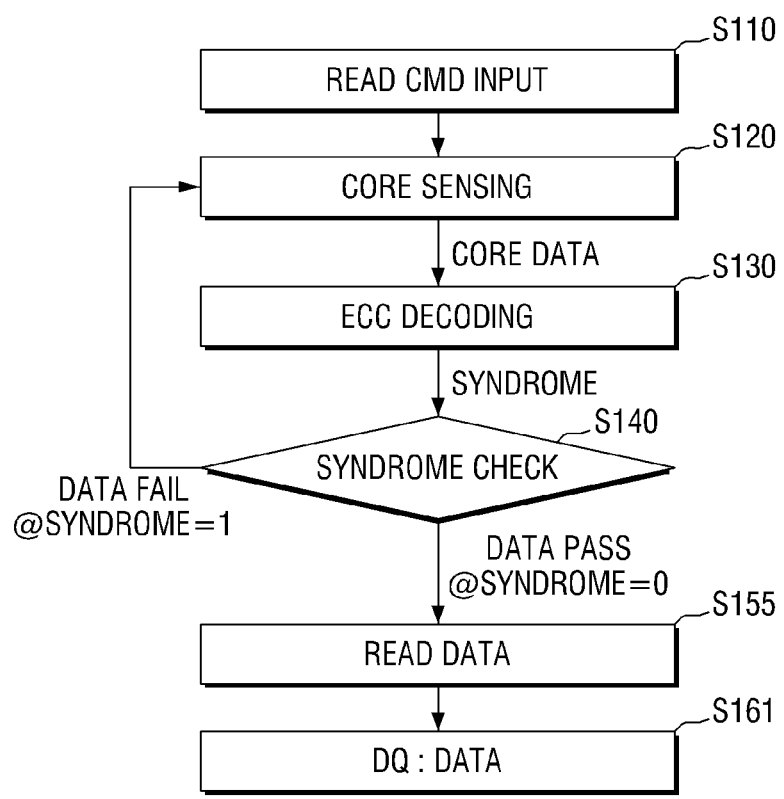
FIG. 11 is a flowchart illustrating a method of driving a nonvolatile memory device according to a second embodiment of the inventive concept.

FIG. 11 is a flowchart illustrating a method of driving a nonvolatile memory device according to an embodiment of the inventive concept. For convenience of the description, descriptions of features that are substantially the same as those described with reference to FIGS. 7 to 10, will be omitted.

Referring to FIG. 11, a read command RD1 is input from a controller (S110). Next, a core sensing operation is performed (S120). That is, data is read by providing a read current of a first level to a nonvolatile memory cell.

Next, an ECC decoding is performed (S130). That is, a syndrome corresponding to the read data is generated. The syndrome is checked (S140). Where the read data is fail, the syndrome is 1, and when the read data is pass, the syndrome is 0.

Where the syndrome is 0, the data is output through a DQ pin (S161) via a read path (S155). Otherwise, where the syndrome is 1, the level of the read current is set to be a second level, and then a read retry operation is performed.

The setting of the level of the read current to the second level may be performed by the nonvolatile memory device itself without a separate control by the controller. Because it is not necessary to provide a determination result to the controller, a separate pin outputting the determination result may not exist.

Figure 12:
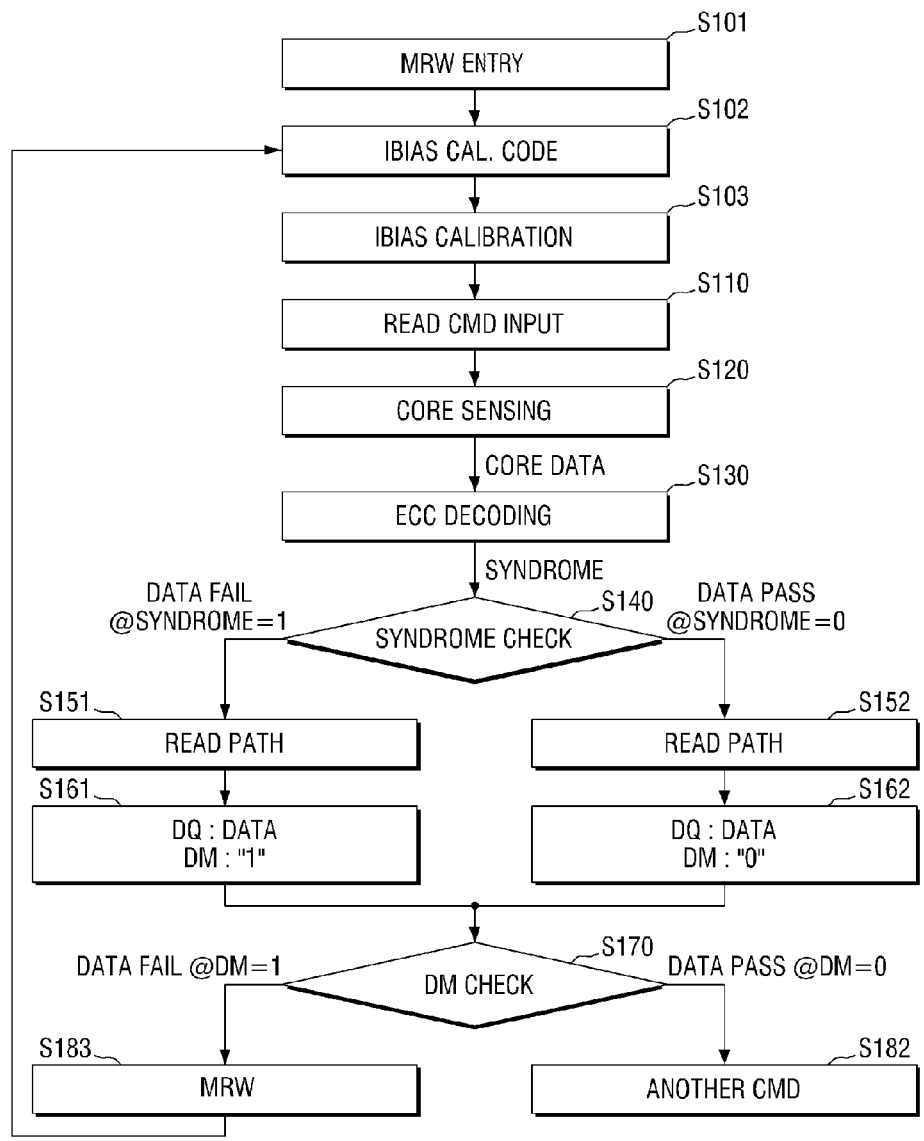
FIG. 12 is a flowchart illustrating a method of driving a nonvolatile memory device according to an embodiment of the inventive concept.
Figure 13:
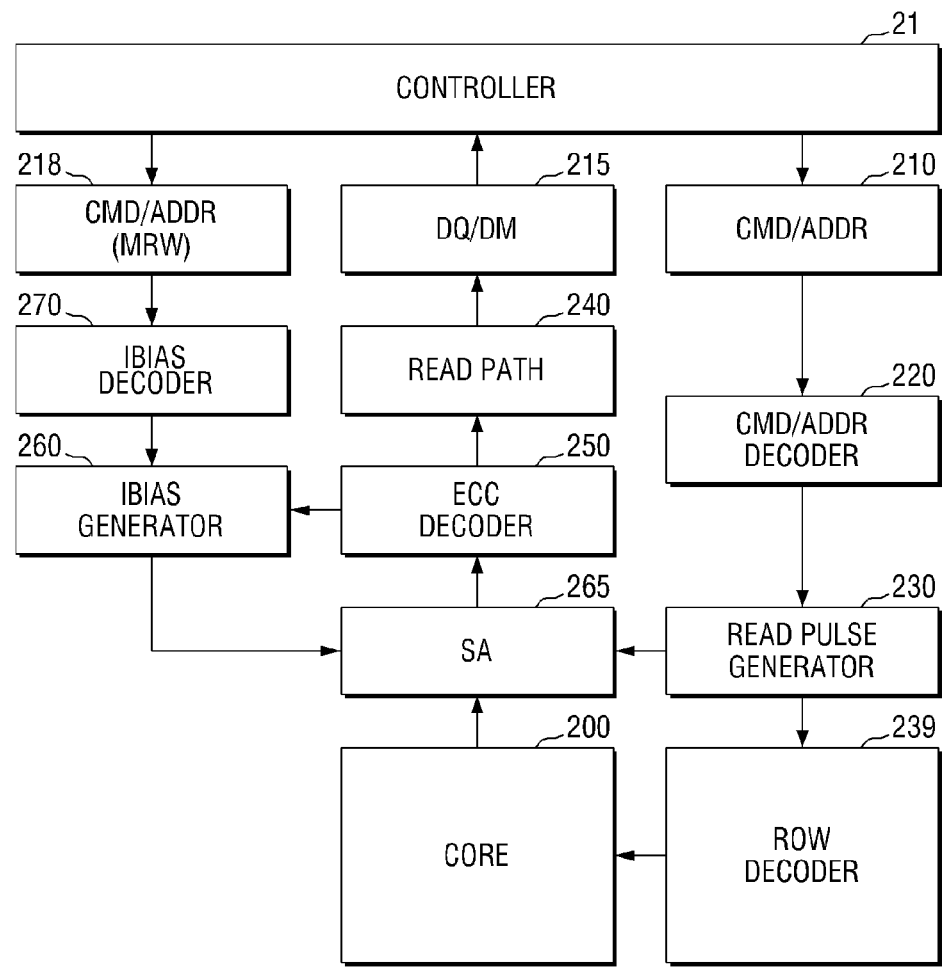
FIG. 13 is a block diagram illustrating the method of FIG. 12 according to an embodiment of the inventive concept.

FIGS. 12 and 13 are a flowchart and a block diagram, respectively, illustrating a method of driving a nonvolatile memory device according to an embodiment of the inventive concept. For convenience, descriptions of features that are substantially the same as those described with reference to FIGS. 7 to 10 will be omitted.

Referring to FIG. 12, the method enters a mode register write (MRW). That is, a read current calibration is started (S101). A first calibration code is provided from a controller (S102). A level of a read current is determined according to the first calibration code (S103). The read current is determined as a first level. Here, the calibration code is a code for changing a level of the read current, and the controller and the nonvolatile memory device share contents of the calibration code with each other.

Next, a first read command RD1 is input from the controller (S110). Then, a core sensing operation is performed (S120). Data is read by providing the read current of the first level to a nonvolatile memory cell. Thereafter, a syndrome corresponding to the read data is generated by performing error correction code (ECC) decoding (S130). The syndrome is checked (S140).

Where the syndrome is 1, the read data is output to a DQ pin, and 1 is output to a DM pin (S161) via a read path (S151). Where the syndrome is 0, the read data is output to the DQ pin and 0 is output to the DM pin (S162) via a read path (S152). The controller checks a value output from the DM pin (S170). Where the value output from the DM pin is 0, the controller provides a new command to the nonvolatile memory device (S182).

Where the value output from the DM pin is 1, the method enters the MRW again (S183). The controller provides a second calibration code, which is different from the first calibration code, to the nonvolatile memory device (S102). A level of the read current is re-determined according to the second calibration code (S103).

Referring to FIG. 13, the nonvolatile memory device comprises core 200, command pin/address pin 210 for read, a command pin/address pin 218 for MRW, command/address decoder 220, read pulse generator 230, row decoder 239, DQ pin/DM pin 215, read path 240, an ECC decoder 250, a sense amplifier 265, a read current generator 260, and a calibration decoder 270.

Controller 21 provides a calibration code through the command pin/address pin for MRW 218.

Calibration decoder 270 decodes a calibration code and provides the decoded calibration code to read current generator 260. Read current generator 260 adjusts a level of the read current according to the decoded calibration code. For example, read current generator 260 may set a level of the read current to a first level according to the first calibration code, and set the level of the read current to a second level according to the second calibration code.

Figure 14:
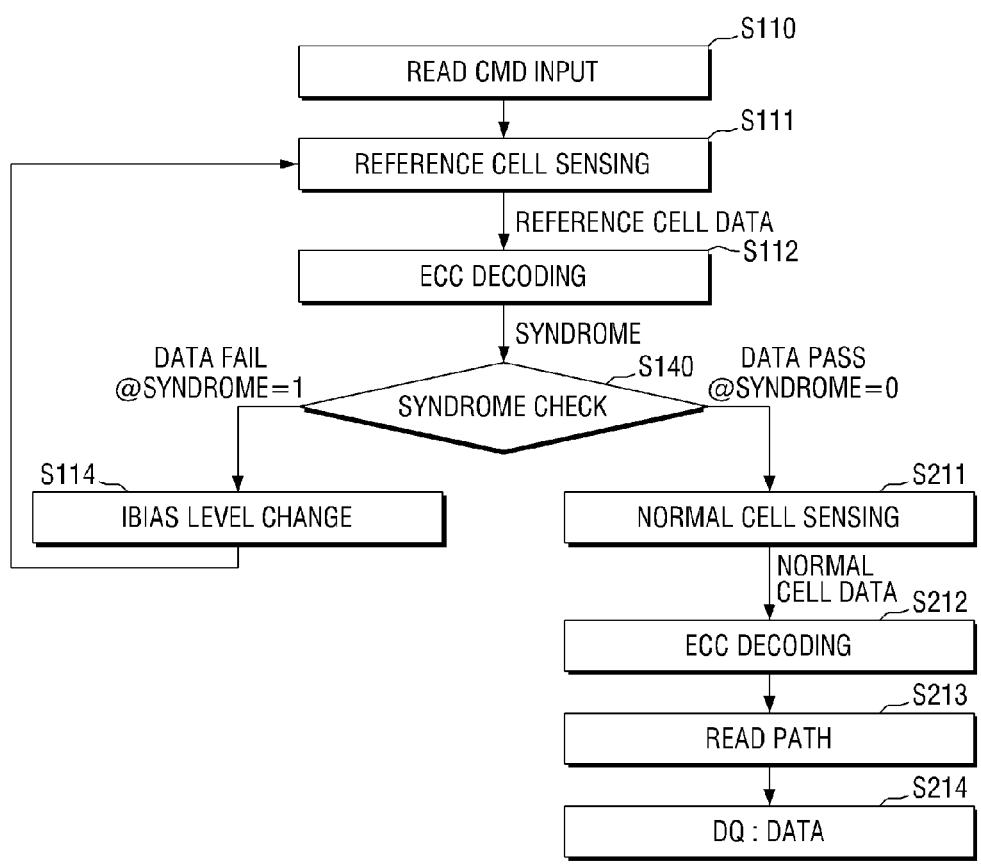
FIG. 14 is a flowchart illustrating a method of driving a nonvolatile memory device according to an embodiment of the inventive concept.
Figure 15:
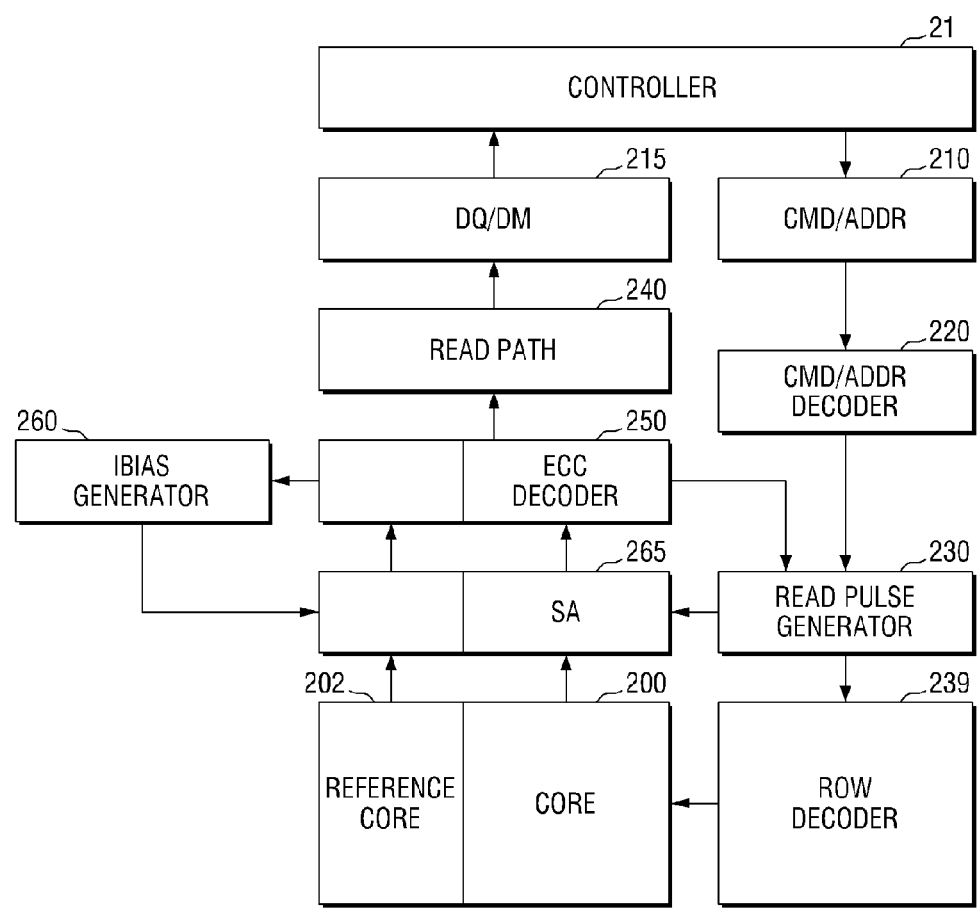
FIG. 15 is a block diagram illustrating a method of driving a nonvolatile memory device according to an embodiment of the inventive concept.

FIGS. 14 and 15 are a flowchart and a block diagram, respectively, illustrating a method of driving a nonvolatile memory device according to a fourth embodiment of the inventive concept, respectively. For convenience, descriptions of features that are substantially the same as those described with reference to FIGS. 7 to 10 will be omitted.

Referring to FIG. 14, a first read command RD1 is input a controller (S110). Next, a reference memory cell is sensed (S111). That is, reference memory cell data is read by providing a read current of a first level to the reference memory cell.

Next, a syndrome corresponding to the read reference memory cell data is generated by performing error correction code (ECC) decoding (S112). The syndrome is checked (S140). Where the syndrome is 1, the level of the read current is changed (S114). That is, the level of the read current is set from the first level to a second level.

The reference memory cell is sensed again (S111), and the syndrome is checked again (S140) by performing the ECC decoding (S112).

Where the syndrome is 1, a process of setting the level of the read current is repeated. On the other hand, when the syndrome is 0, a process of setting the level of the read current is terminated. The level of the read current is determined as the second level. Next, a normal memory cell is sensed (S211). That is, normal cell data is read by providing the read current of the second level to the normal memory cell. The ECC decoding is performed (S212), and the read normal cell data is output to a DQ pin (S214) via a read path (S213).

Referring to FIG. 15, the nonvolatile memory device comprises a reference core 202 adjacent to a core 200 and including multiple reference memory cells. A sense amplifier 265 reads the reference memory cell data from the reference memory cell positioned in reference core 202, and an ECC decoder 250 generates a syndrome corresponding to the reference memory cell data. A read current generator 260 may set the level of the read current again by receiving the syndrome.

Figure 16:
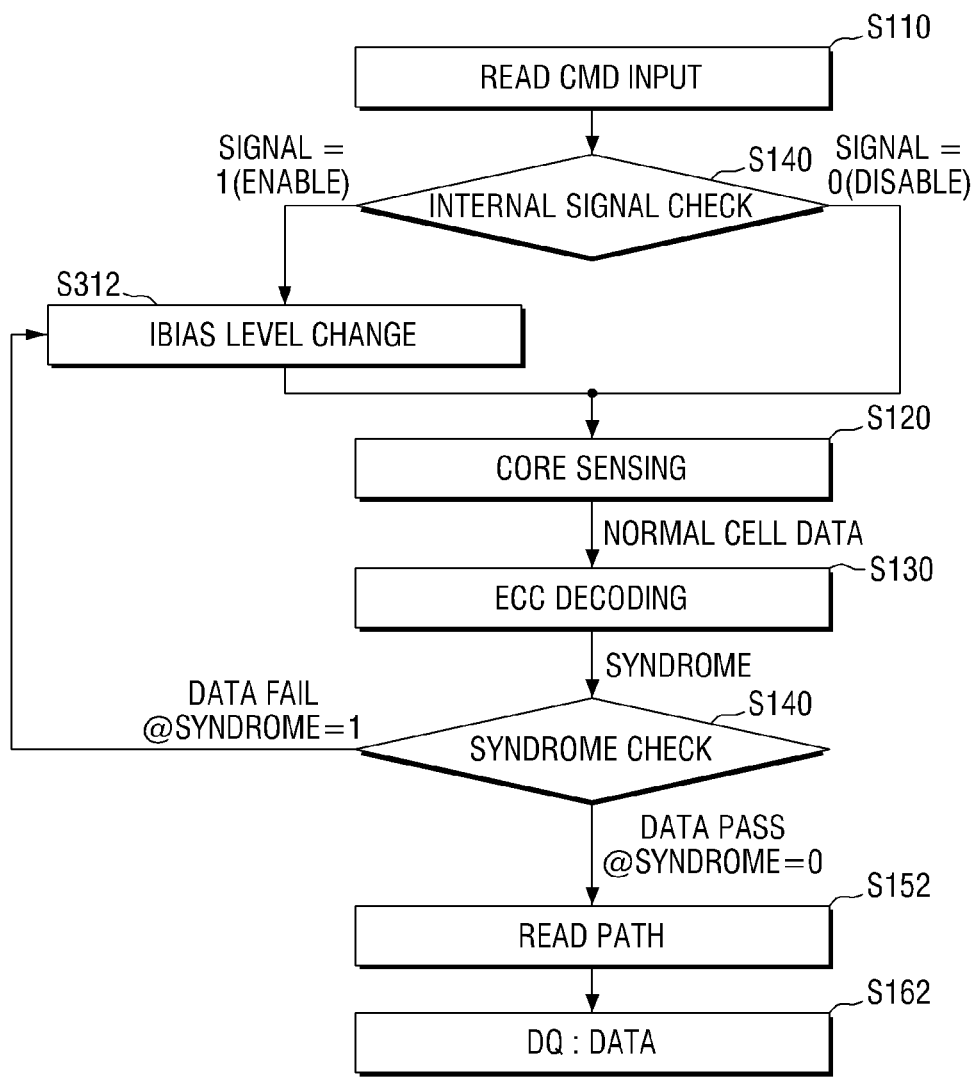
FIG. 16 is a flowchart illustrating a method of driving a nonvolatile memory device according to an embodiment of the inventive concept.
Figure 17:
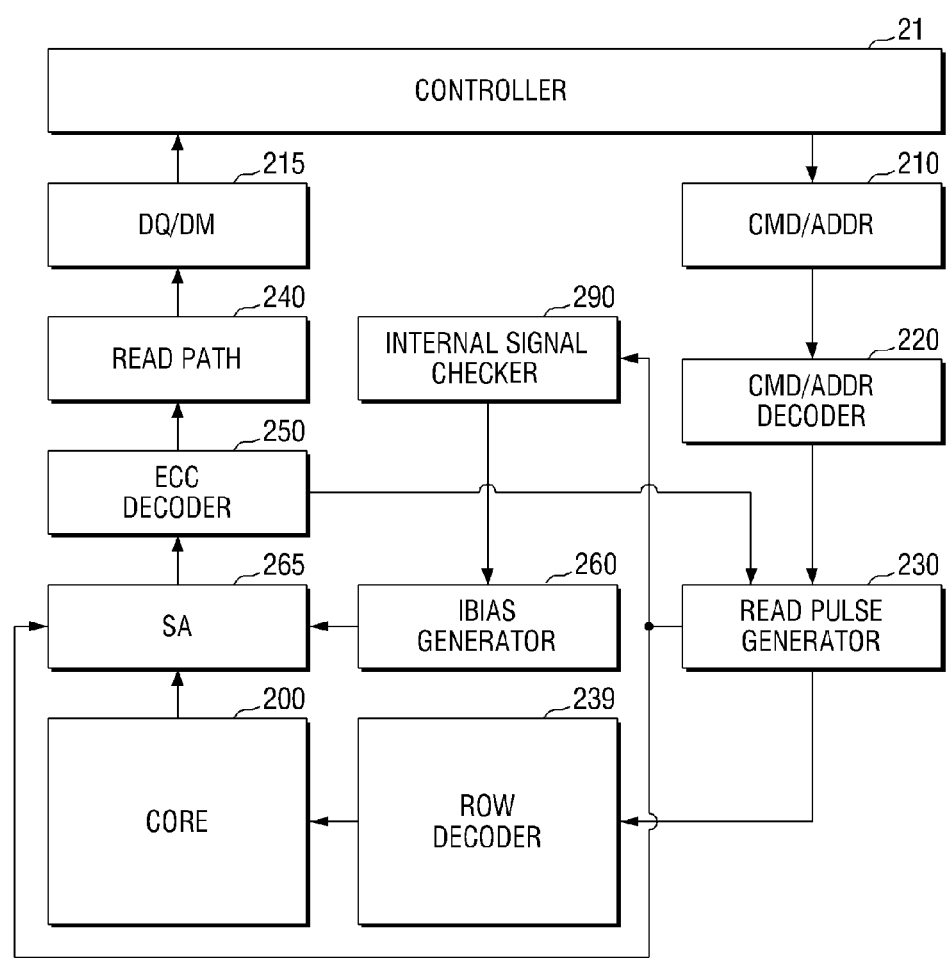
FIG. 17 is a block diagram illustrating a method of driving a nonvolatile memory device according to an embodiment of the inventive concept.

FIGS. 16 and 17 are a flowchart and a block diagram, respectively, illustrating a method of driving a nonvolatile memory device according to an embodiment of the inventive concept. For convenience, descriptions of features that are substantially the same as those described with reference to FIGS. 7 to 10 will be omitted.

Referring to FIG. 16, a first read command RD1 is input from a controller (S110). Next, a predetermined internal signal is checked (S140). Here, the internal signal may be a signal associated with a set resistance drift or a reset stabilization time tWTR. The internal signal may be, for example, a flag signal enabled in a case where the read command is input within a specific time after writing. Otherwise, the internal signal may be a signal associated with read while write (RWW). The reason is that because resistance distribution is unstable during the RWW operation, it is necessary to reset the level of the read current.

In a case where the internal signal is enabled, a level of the read current is changed (S312). In the meantime, in a case where the internal signal is not enabled, the level of the read current is not changed. Next, a core sensing operation is performed (S120). Then, error correcting code (ECC) decoding is performed (S130).

A syndrome is checked (S140). Where the syndrome is 1, the level of the read current is re-changed (S312). However, where the syndrome is 0, the read data is output to a DQ pin via the read path (S162).

Referring to FIG. 17, the nonvolatile memory device comprises core 200, command pin/address pin (CMD/ADDR) 210, command/address decoder 220, read pulse generator 230, row decoder 239, DQ pin/DM pin 215, read path 240, ECC decoder 250, sense amplifier 265, read current generator 260, and an internal signal checker 290.

Internal signal checker 290 checks the aforementioned signal associated with the set resistance drift or the reset stabilization time tWTR. A check result is provided to read current generator 260. Read current generator 260 adjusts the level of the read current according to the check result.

FIGS. 18 to 22 are drawings illustrating a memory system according to an embodiment of the inventive concept. Here, FIGS. 18 to 22 relate to memory systems using nonvolatile memory devices such as those described above.

Figure 18:
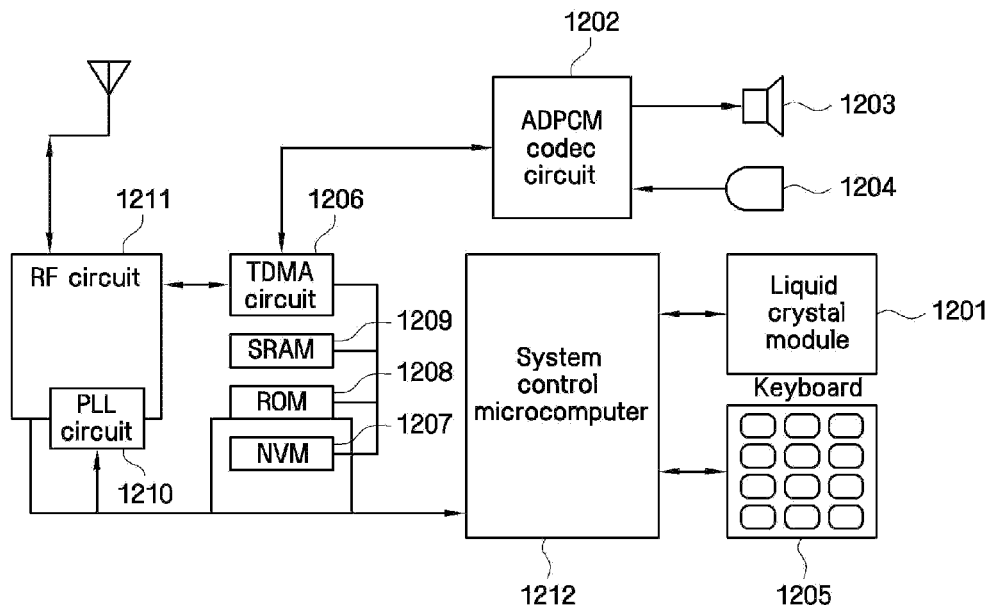
FIG. 18 is a diagram illustrating a cellular phone system comprising a nonvolatile memory device according to an embodiment of the inventive concept.

FIG. 18 is a diagram illustrating a cellular phone system comprising one or more nonvolatile memory devices according to an embodiment of the inventive concept.

Referring to FIG. 18, the cellular phone system may include an ADPCM codec circuit 1202 compressing or decompressing sound, a speaker 1203, a microphone 1204, a TDMA circuit 1206 for time division multiplexing digital data, a PLL circuit 1210 for setting a carrier frequency of a wireless signal, and an RF circuit for transmitting or receiving a wireless signal.

The cellular phone system may include several types of memory devices, and may include, for example, a nonvolatile memory device 1207, a ROM 1208, and an SRAM 1209. The nonvolatile memory devices may be used for nonvolatile memory device 1207, which may store, for example, an ID number. ROM 1208 may store a program, and SRAM 1209 serves as a working area for a system control microcomputer 1212 or temporarily stores data. Here, system control microcomputer 1212 may control a write operation and a read operation of nonvolatile memory device 1207 as a processor.

Figure 19:
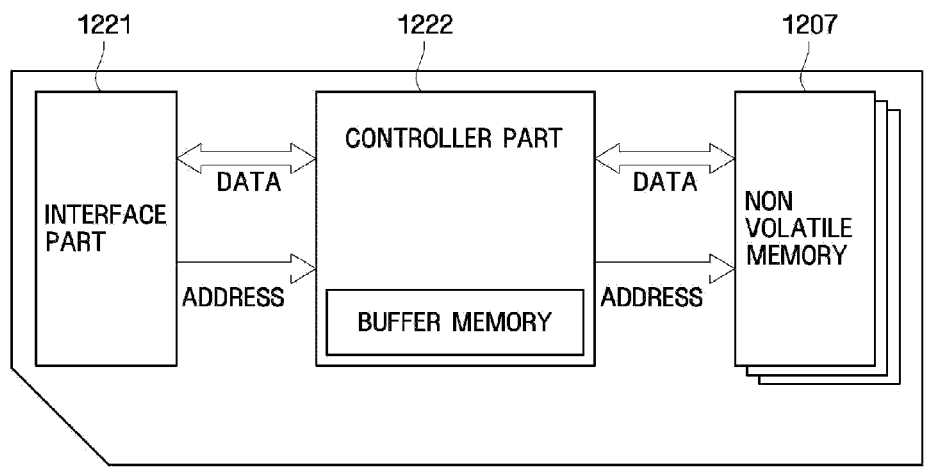
FIG. 19 is a diagram illustrating a memory card comprising a nonvolatile memory device according to an embodiment of the inventive concept.

FIG. 19 is a diagram illustrating a memory card using the nonvolatile memory devices according to the embodiments of the inventive concept. The memory card may be, for example, an MMC card, an SD card, a multiuse card, a micro SD card, a memory stick, a compact SD card, an ID card, a PCMCIA card, an SSD card, a chipcard, a smartcard, or a USB card.

Referring to FIG. 19, the memory card comprises an interface unit 1221 performing interfacing with an external device, a controller 1222 including a buffer memory and controlling an operation of the memory card, and at least one of nonvolatile memory devices 1207 according to the embodiments of the inventive concept. Controller 1222 controls a write operation and a read operation of nonvolatile memory device 1207 as a processor. Particularly, controller 1222 is coupled with nonvolatile memory device 1207 and interface unit 1221 through a data bus DATA and an address bus ADDRESS.

Figure 20:
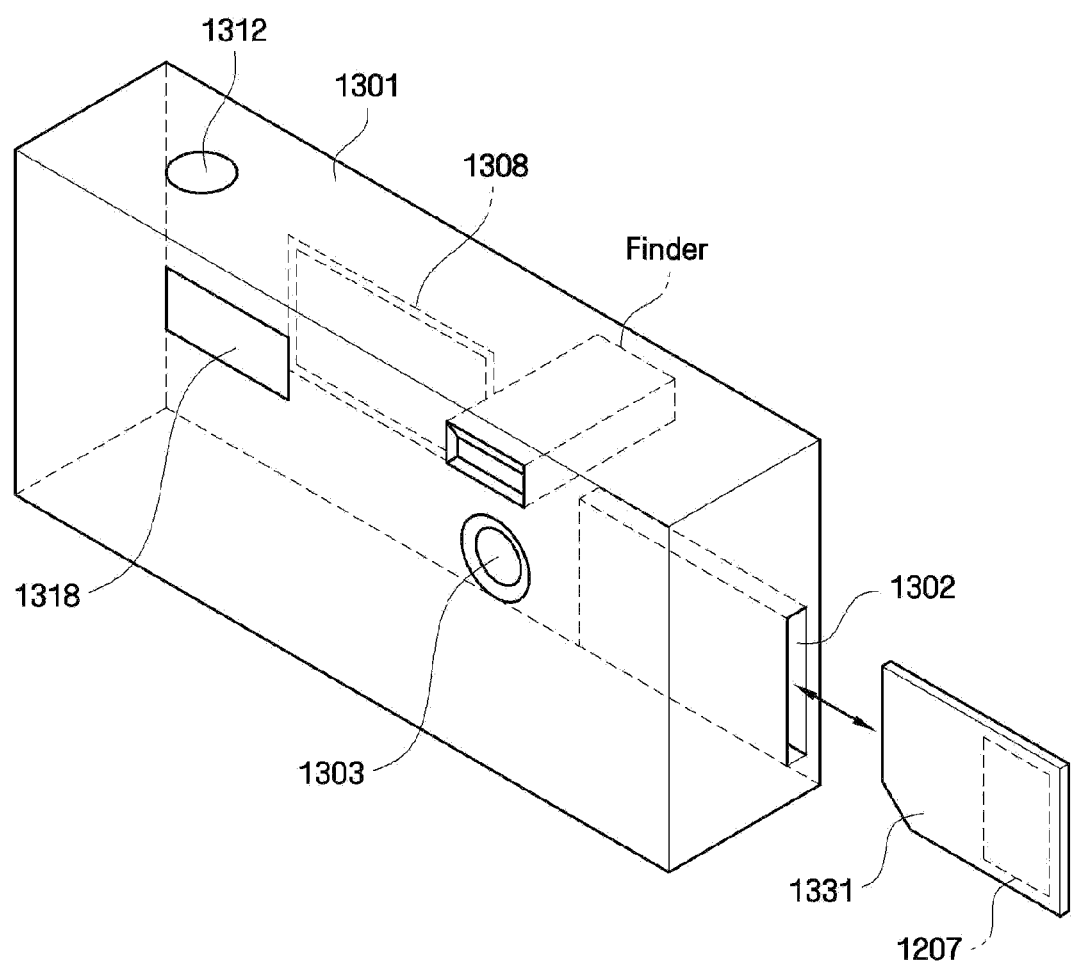
FIG. 20 is a diagram illustrating a digital still camera comprising a nonvolatile memory device according to an embodiment of the inventive concept.

FIG. 20 is a diagram illustrating a digital still camera comprising a nonvolatile memory device according to an embodiment of the inventive concept.

Referring to FIG. 20, the digital still camera comprises a body 1301, a slot 1302, a lens 1303, a display unit 1308, a shutter button 1312, and a strobe 1318. A memory card 1331 may be inserted into slot 1308, and memory card 1331 may include at least one of nonvolatile memory devices 1207.

Where memory card 1331 is a contact type, memory card 1331 is electrically in contact with a specific electric circuit on a circuit board when memory card 1331 is inserted into slot 1308. Where memory card 1331 is a non-contact type, memory card 1331 communicates with memory card 1331 through a wireless signal.

Figure 21:
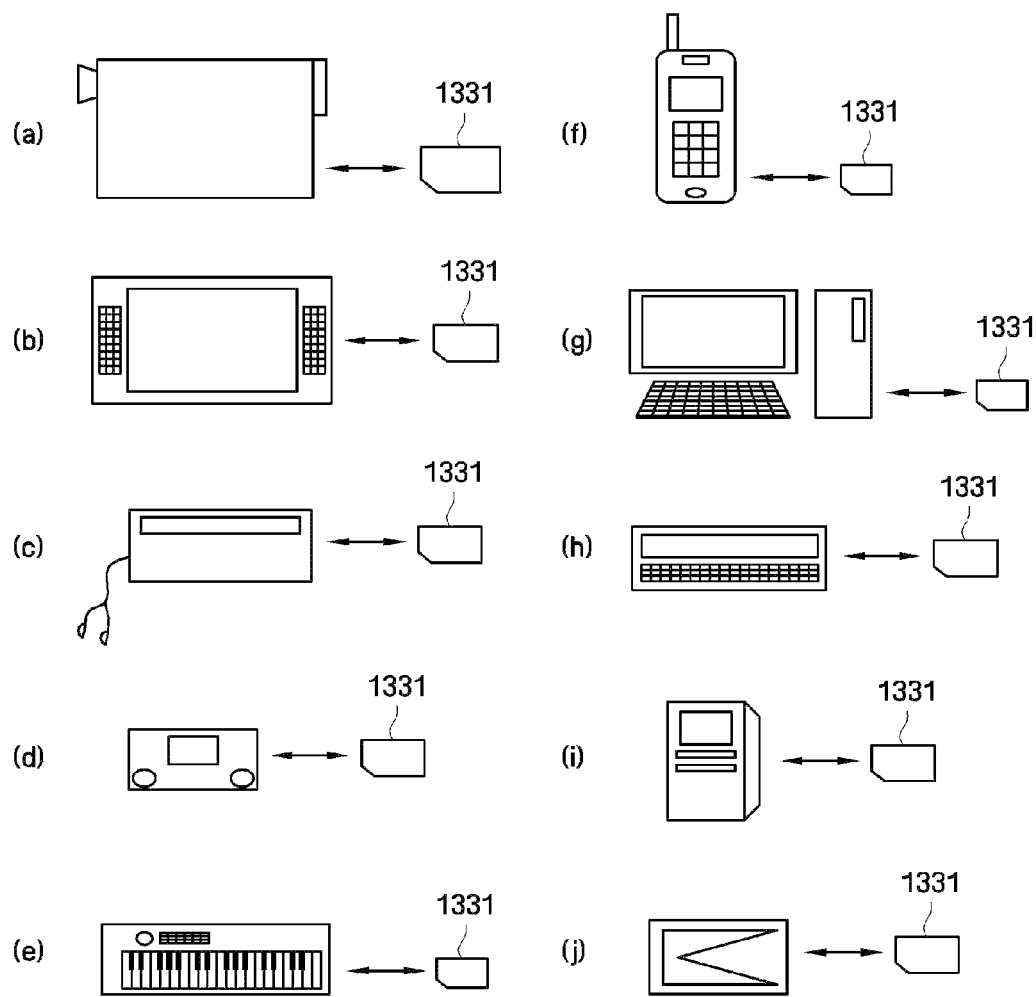
FIG. 21 is a diagram illustrating various systems comprising the memory card of FIG. 19, according to embodiments of the inventive concept.

FIG. 21 is a diagram describing various systems comprising the memory card of FIG. 19, according to various embodiments of the inventive concept.

Referring to FIG. 21, memory card 1331 may be used in (a) a video camera, (b) a television, (c) an audio device, (d) a game device, (e) an electronic musical device, (f) a cellular phone, (g) a computer, (h) a personal digital assistant (PDA), (i) a voice recorder, (j) a PC card, and the like.

Figure 22:
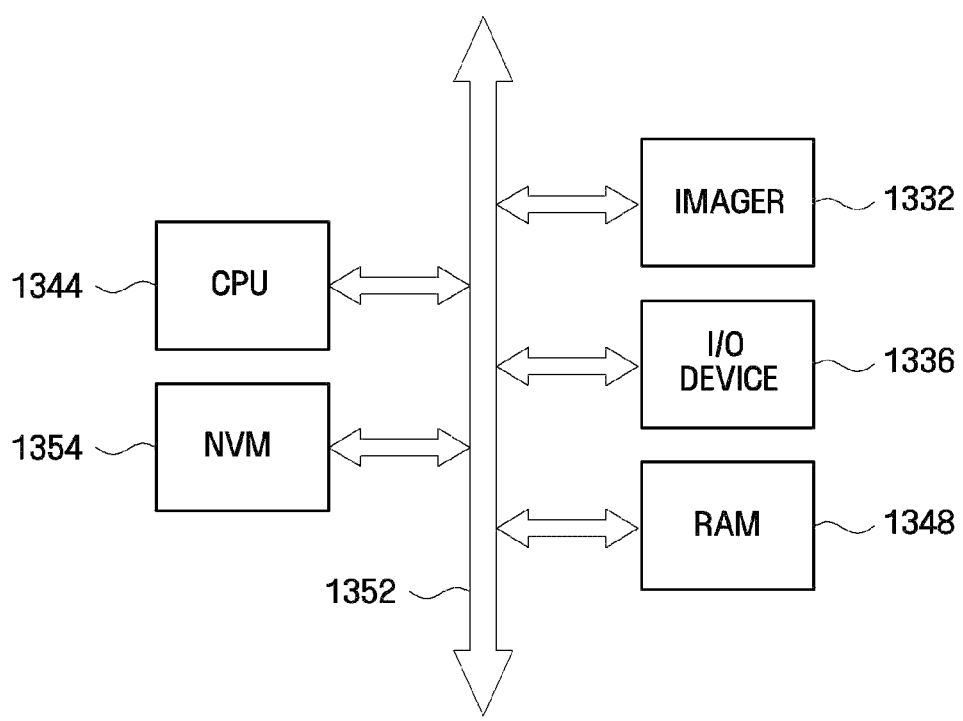
FIG. 22 is a diagram illustrating an image sensor system comprising a nonvolatile memory device according to an embodiment of the inventive concept.

FIG. 22 is a diagram illustrating an image sensor system using the nonvolatile memory devices according to the embodiments of the inventive concept.

Referring to FIG. 22, the image sensor system comprises an image sensor 1332, an input/output device 1336, an RAM 1348, a CPU 1344, and nonvolatile memory device 1354. Each constituent element, that is, image sensor 1332, the input/output device 1336, RAM 1348, CPU 1344, and nonvolatile memory device 1354 communicate with each other through a bus 1352. Image sensor 1332 may include a photo sensing element, such as a photogate and a photodiode. The respective constituent elements may be configured as one chip together with a processor, or may be configured as a separate chip from a processor.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A method of operating a nonvolatile memory device, comprising:
receiving a first calibration code from a controller and determining a first read current having a first level according to the first calibration code;
applying the first read current to a nonvolatile memory cell comprising a variable resistance material, and determining read data based on the applied first read current;

checking a syndrome corresponding to the read data to determine whether the read data is pass or fail;

changing the first read current to a second read current having a second level different from the first level in response to the determination of whether the read data is pass or fail and in response to a second calibration code from the controller; and performing a read-retry operation comprising applying the second read current to the nonvolatile memory cell.

2. The method of claim 1, wherein changing the first read current to the second read current comprises changing a level of a constant voltage for sensing, and generating the second read current using the changed constant voltage for sensing.

3. The method of claim 1, further comprising:

generating multiple read currents having different levels and including the first read current and the second read current, before applying the first read current to the nonvolatile memory cell, wherein applying the first read current to the nonvolatile memory cell comprises selecting the first read current from among the multiple read currents, and changing the first read current to the second read current comprises selecting the second read current from among the multiple read currents.

4. The method of claim 1, further comprising providing a result of the determination of whether the read data is pass or fail to the controller through a predetermined pin.

5. The method of claim 1, wherein the nonvolatile memory cell is a reference memory cell, and determining the read data comprises reading reference memory cell data stored in the reference memory cell.

6. The method of claim 1, wherein applying the first read current to the nonvolatile memory cell comprises checking a predetermined internal signal and setting the first read current to the first level in response to the internal signal.

7. The method of claim 6, wherein the nonvolatile memory cell is a resistive memory cell or a phase change memory cell.

8. A method of operating a nonvolatile memory device, comprising:

reading reference memory cell data by applying a read current with a first level to a reference memory cell;

determining whether the read reference memory cell data is pass or fail;

setting the level of the read current to a second level, which is different from the first level, according to a result of the determination;

performing a read-retry operation on the reference memory cell by applying a read current with a second level to the reference memory cell; and where read-retried reference memory cell data is pass, applying the read current with the second level to a normal memory cell to read normal cell data.

9. The method of claim 8, wherein the setting of the level of the read current to the second level comprises changing a level of a constant voltage for sensing according to the result of the determination, and generating the read current of the second level by using the changed constant voltage for sensing.

10. The method of claim 8, wherein at least one of the reference memory cell and the normal memory cell is a resistive memory cell or a phase change memory cell.

11. The method of claim 8, further comprising applying the result of the determination to a controller through a predetermined pin.

12. The method of claim 8, wherein applying the read current with the first level to the reference memory cell comprises receiving a first calibration code from a controller, and determining a level of the read current according to the first calibration code.

13. A method of operating a nonvolatile memory device, comprising:

checking a predetermined internal signal of the nonvolatile memory device;

changing a level of a read current to a first level according to a result of the checking;

reading data by applying the read current with the first level to a nonvolatile memory cell comprising a resistance material;

determining whether the read data is pass or fail;

changing the level of the read current to a second level, which is different from the first level, according to a result of the determination of whether the read data is pass or fail; and performing a read-retry operation comprising applying the read current of the second level to the nonvolatile memory cell, wherein changing the level of the read current to the second level comprises receiving a second calibration code from the controller and changing the level of the read current according to the second calibration code.

14. The method of claim 13, wherein changing the level of the read current comprises changing a level of a constant voltage for sensing, and generating the read current with the second level using the changed constant voltage for sensing.

15. The method of claim 13, further comprising:

generating multiple read currents having different levels before applying the read current with the first level to the nonvolatile memory cell, wherein applying the read current with the first level to the nonvolatile memory cell comprises selecting a read current among the read currents and applying the selected read current to the nonvolatile memory cell, and the changing the read current to the second level comprises selecting another read current among the read currents and applying the selected another read current to the nonvolatile memory cell.

16. The method of claim 13, further comprising providing the result of the determination of whether the read data is pass or fail to a controller through a predetermined pin.

17. The method of claim 13, wherein applying the read current with the first level to the nonvolatile memory cell comprises receiving a first calibration code from a controller, and determining a level of the read current according to the first calibration code.

* * * * *